(12) United States Patent
Nowicki et al.

(10) Patent No.: US 8,680,872 B2
(45) Date of Patent: Mar. 25, 2014

(54) IDENTIFICATION OF FALSE POSITIVES IN HIGH IMPEDANCE FAULT DETECTION

(75) Inventors: Tomasz J. Nowicki, Yorktown Heights, NY (US); Grzegorz M. Swirszcz, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 426 days.

(21) Appl. No.: 12/569,294

(22) Filed: Sep. 29, 2009

(65) Prior Publication Data
US 2011/0074436 A1     Mar. 31, 2011

(51) Int. Cl.
*G01R 31/02*     (2006.01)

(52) U.S. Cl.
USPC .............. 324/539; 324/509; 324/520; 702/58

(58) Field of Classification Search
USPC ....................................................... 324/539
See application file for complete search history.

(56) References Cited

U.S. PATENT DOCUMENTS

| 4,459,545 | A | * | 7/1984 | Maeda | 324/103 P |
| 4,851,782 | A | * | 7/1989 | Jeerings et al. | 324/520 |
| 4,871,971 | A | * | 10/1989 | Jeerings et al. | 324/509 |
| 5,659,453 | A | | 8/1997 | Russell et al. | |
| 2009/0088989 | A1 | * | 4/2009 | Guzman-Casillas | 702/58 |
| 2009/0187285 | A1 | * | 7/2009 | Yaney et al. | 700/292 |
| 2009/0204347 | A1 | * | 8/2009 | Nowicki et al. | 702/58 |

* cited by examiner

*Primary Examiner* — Benjamin M Baldridge
(74) *Attorney, Agent, or Firm* — Scully, Scott, Murphy & Presser, P.C.; Daniel P. Morris

(57) ABSTRACT

A method, system and computer program product are disclosed for identifying false positive indications of high impedance faults in an AC electric power transmission and distribution network. In one embodiment, the method comprises using a procedure to monitor a phase conductor of the network for faults, said procedure generating a fault signal indicating a specified fault in the conductor. In this embodiment, the voltage and current waveform of the electric power conducted through the conductor are monitored. When a phase shift in said waveform is detected over a defined period of time, and said detected phase shift meets one or more given criteria, a correction signal is generated indicating that said fault signal is a false indication of the specified fault. The given criteria may include, for example, that the phase shift is more than a threshold value for a specified period of time.

9 Claims, 4 Drawing Sheets

IDENTIFICATION OF FALSE POSITIVES IN HIGH IMPEDANCE FAULT DETECTION

BACKGROUND OF THE INVENTION

1. Field of the Invention

This invention relates generally to detecting high impedance faults and more particularly to system and method of identifying false positive indications of high impedance faults in electric power transmission and distribution networks.

2. Description of the Related Art

Three phase distribution networks carry energy along three separate conductors while maintaining a line voltage difference between any two of the conductors. Under normal operating conditions, the three voltages are symmetrical about a neutral point. Voltage measured between a conductor and the neutral point is referred to as the phase voltage.

Where star (Y) connected transformer windings are used at a source station, the star point corresponds to the neutral position. For certain circuits, this neutral point is brought out as a fourth conductor and can carry load current for loads connected between a phase and a local ground or earth. This is the common arrangement for 120 volt low voltage (LV) circuits and is used extensively in the United States.

Each conductor or phase also has a voltage with respect to its surrounding environment, mainly the local ground or earth. Load current normally flows out from one or more of the phases and returns through the other phase wire(s). In the event of a fault such as a conductor coming in contact with the physical ground, some current flows into the ground. This fault current must find its way back to the source, i.e., into the electrical network. The network neutral point is generally connected to earth at the source to provide such a return path. Fault current for a network earth fault generally flows from the phase conductor, through earth to the neutral-earth connection.

There are many ways to connect a network neutral to earth. In one example, the neutral point is left isolated. In this case, fault current flows back into the system through a weak capacitive connection between earth and the remaining phase wires. Relatively little fault current can flow through this capacitive link in the event of a fault, and faults are difficult to detect. However, by taking certain precautions, these faults can be tolerated on a network because it is not necessary to immediately trip the circuit and interrupt a supply to customers. Isolated neutral circuits are predominantly used on rural overhead networks, where faults are frequent, damage is less severe, and it is desirable to minimize frequent outages.

In another example where the neutral is connected to earth, impedance such as a resistor is used in the neutral-earth link to limit the amount of current that can flow during a fault. When low impedance devices are used, faults can be detected easily but must be cleared quickly. This arrangement is referred to as a low impedance earth network. When high impedance devices are used, fault currents are limited so that damage is limited and faults can be sustained on the network. This arrangement is referred to as a high impedance earth network. Isolated neutral networks are classified as high impedance earth networks because the capacitive coupling is effectively a high impedance link to earth.

High impedance earth networks offer better operational performance in rural overhead networks when earth faults can be detected reliably. Once a fault is detected, the simplest corrective measure is to trip the circuit. However, this can be very disruptive to customers when frequent fault events occur. Where it is desired to maintain a supply of power in the event of a fault, the fault current must be brought to a very low level at the fault site.

There are two method used for reducing fault current at a fault site. One method is to install an arc-suppression coil in the neutral-earth link at the source station. The coil diverts or tunes out most of the fault current. A second method involves the use of an earth switch to connect the faulted phase directly to earth at the source station. This switching shorts out the fault by diverting the bulk of the fault current directly to the station. This method is referred to as a faulted phase earth connection.

The impedance of the fault at the fault site also determines the amount of current that flows in an earth fault. Low impedance faults facilitate current flow, allowing the fault to be readily detected, whereas high impedance faults restrict current flow, making detection more difficult.

A typical single phase high impedance fault occurs when, for example, a tree branch contacts a high voltage distribution power line. This often results in an arc between the tree and the power line, which is a high impedance fault. High impedance faults are also associated with fallen conductors and are extremely dangerous despite a restricted current flow.

There are factors that mitigate against high impedance fault detection. During the normal operation of a network, there is always a certain amount of current flowing to earth through the capacitive links between each phase conductor and earth. When one of the phase wires is switched, for example, during normal operations or load switching, these currents can be interrupted or become unbalanced. Unbalance currents flow in the earth and in any neutral-earth link, and can appear as an earth fault. As these are normal operational events, a protection system must discriminate between such events and real faults.

These issues arise in relation to overhead medium voltage (MV) distribution networks, which are much more extensive than underground networks, because the conductors are exposed to weathering. Additionally, bare conductors located above ground increase the risk of exposing the public to hazards in the event of an accident.

In a high impedance earth network, the phase voltages during an earth fault are disturbed. These disturbances can be used to detect earth faults in a protection system that is also affected by operational events and must operate with limited sensitivity. To limit spurious operation, a threshold of a maximum possible fault current is set, for example, at a 15 amp fault current in a 10 kV network. Therefore, any fault below 5 A will not be detected.

In a low impedance neutral system, when an earth fault occurs, the faulted phase must be tripped, which has continuity and supply quality implications. With high impedance earth circuits, earth faults may be sustained, which can, in turn, have safety implications. High impedance earth circuits impose higher voltage stress on a network and can lead to faults which can have more serious consequences than a simple earth fault.

The type of neutral earth circuit used determines the fault currents and voltages that occur during an earth fault. With a low impedance neutral earth circuit on an existing 20 kV network, conventional over-current type protection may be used to provide a reasonable degree of protection. However, where high impedance neutral earth detection is required, a more sophisticated technique is needed.

If high impedance fault protection of a neutral earth circuit of a rural MV network is required, two options are available. First, arc-suppression with a coil is frequently used. However, there are significant difficulties with arc-suppression in rural networks. The widespread use of single phase spurs in a rural network and the consequent phase imbalance can cause neutral voltages that are above earth potential and a continuous voltage stress on the network.

A very dangerous type of fault is a fallen conductor, which brings high voltage down to ground level and within reach of the public. Where the fallen conductor is on the source side of a break, that is, connected directly to the source, there is a reasonable probability of fault detection depending on ground conditions. Where the fallen conductor is on the load side of a break, the fault can be considerably more difficult to detect because the fault current must first flow through the downstream load before reaching the fault. If there is a small load at the time of the break, such as for example at night, the load impedance may be very high.

For example, a 40 kVA single phase load at 20 kV would correspond to a load impedance of about 12,000 ohms. This will limit the earth fault current to about 1 amp. The ground potentials at the fault site may be low but somebody touching the conductor could be exposed to a lethal voltage. It is, therefore, desirable to detect as many of these faults as is possible.

The use of extensive single phase networks for rural MV networks can result in significant imbalances. Furthermore, imbalances that are caused by single pole switching and fuse blowing are very similar to earth faults. For example, opening a link or blowing a fuse on a 50 km long single phase spur can result in 50 km of a conductor being removed from one phase and added to another phase through the load. The effect is to cause an unbalanced current of less than about 2 amps in the neutral conductor of a 20 kV network. Similar events in a three phase network have even greater effects, especially when the switching occurs close to the source station.

The use of boosters in an open delta configuration introduces an additional complication. When a network is parallel-connected through a booster, the open delta configuration causes a shift in the position of the neutrals between the two networks. This neutral shift causes a circulating current in the neutrals of an earth neutral 20 kV network or neutral displacement in the case of a 10 kV network. A high impedance fault detection system should distinguish between such effects and a real earth fault.

Single pole switching to parallel networks introduces a voltage displacement between the neutral points. If there is a difference in the voltage drops between the networks where they are parallel-connected, the difference is taken up in the neutral points. This difference causes circulating currents in the neutrals, which from the source, appear very similar to an earth fault. Again, adequate earth fault protection should be able to discriminate between a switching event and an earth fault. The demands on sensitive earth fault protection systems for rural networks are particularly severe due to the presence of single phase spurs.

There have been several efforts to use the transient effects arising from a fault to detect high impedance faults. However, different solutions have been developed for differing classes of faults and no universal solution based on analyzing such transient effects has evolved. Present systems attempt to amalgamate the existing various techniques into a composite system to apply the most appropriate technique to a particular fault. Alternatively, all the available techniques are applied simultaneously and a consensus is derived between them on whether there is a fault or not.

However, of all the various systems and/or methods for detecting high impedance faults, none are directed to distinguishing between a false positive indication of a high impedance fault and an actual high impedance fault.

U.S. Pat. No. 5,659,453 discloses an apparatus for detecting arcing faults on power lines carrying a load current by identifying bursts of each half cycle of the fundamental current. While the apparatus and method shown is highly suited to the detection of arc faults, it does not show or suggest a method for detecting permanent, non arcing faults or high impedance faults.

U.S. Pat. No. 4,871,971 uses phase shifts to detect faults. In this reference, it is noted that phase shifts are not typical for most occurrences of high impedance faults because most of the occurrences of high impedances faults often incorporate resistant type effects. Usually, with high impedance faults, no inductance/capacitance is involved, and these are the two effects that lead to phase shifts, while resistance type anomalies manifest themselves rather in amplitude disturbances.

SUMMARY OF THE INVENTION

Embodiment of the invention provide a method, system and computer program product for identifying false positive indications of high impedance faults in an AC electric power transmission and distribution network, said network including a phase conductor for conducting AC electrical power. In one embodiment, the method comprises using a given procedure to monitor the phase conductor for specified faults, said procedure generating a fault signal indicating one of said specified faults in the conductor; and monitoring a voltage and current waveform of the electric power conducted through the conductor. In this embodiment, when a phase shift in said waveform is detected over a defined period of time, and said detected phase shift meets one or more given criteria, a correction signal is generated indicating that said fault signal is a false indication of said one of the specified faults.

In another embodiment, the invention provides a system for identifying false positive indications of high impedance faults in an AC electric power transmission and distribution network. This network includes a phase conductor for conducting AC electrical power, and a fault detector to monitor the phase conductor for specified faults. At times, the fault detector generates a fault signal indicating one of said specified faults in the conductor. In one embodiment, the system for identifying false positives includes a monitor for monitoring a voltage and current waveform of the electric power conducted through the conductor; and a false positive detection unit for detecting phase shifts in said waveform and for generating a correction signal indicating that said fault signal is a false indication of said one of the specified faults, when a detected phase shift in said waveform meets one or more given criteria.

In another embodiment, the invention provides an article of manufacture comprising at least one computer usable medium having computer readable program code logic to identify false positive indications of high impedance faults in an AC electric power transmission and distribution network. This network includes a phase conductor for conducting AC electrical power, and a given procedure is used to monitor the phase conductor for specified faults, and a monitor for monitoring a voltage and current waveform of the electric power conducted through the conductor. At times, the given procedure generates a fault signal indicating one of said specified faults in the conductor. In one embodiment, the computer readable program code logic, when executing, performs the following: when a phase shift in said waveform is detected over a defined period of time, and said detected phase shift meets one or more given criteria, generating a correction signal indicating that said fault signal is a false indication of said one of the specified faults.

In one embodiment, said given criteria includes said phase shift is more than a threshold value, and more particularly, said given criteria may include said phase shift is more than the threshold value for a specified period of time. Also, in one embodiment, the monitoring includes generating a mean value for said phase shift over a given period of time, and comparing a value for said phase shift at a particular time to said mean value. In one embodiment, the generating the correction signal includes generating the correction signal when the value for the phase shift at the particular time exceeds said mean value by a given threshold.

In one embodiment, the monitoring includes generating a squash curve from said phase shift based on said comparing, and the generating the correction signal includes generating the correction signal when the squash curve has a specified value. In one embodiment, the generating the squash curve includes giving the squash curve a first value when the value for the phase shift exceeds said mean value by more than a threshold level, and giving the squash curve a second value when the value for the phase shift does not exceed said mean value by said threshold level.

BRIEF DESCRIPTION OF THE DRAWINGS

Other aspects, features, and advantages of the present invention will become more fully apparent from the following detailed description, the appended claims, and the accompanying drawings in which similar elements are given similar reference numerals.

DETAILED DESCRIPTION OF THE INVENTION

Figure 1:
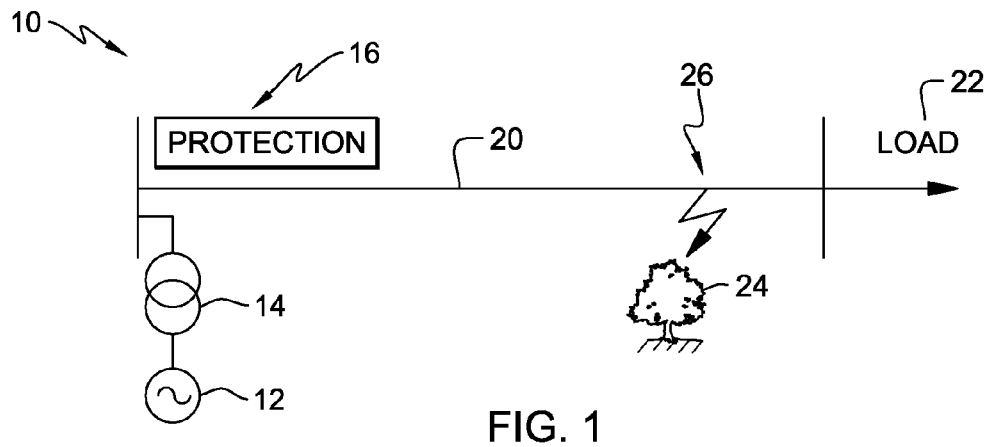
FIG. 1 shows a diagrammatic representation of a typical high impedance arcing fault.

FIG. 1 is a schematic diagram of a typical electrical distribution system 10 which may be affected by high impedance arcing faults. A source 12 of AC electricity is coupled through a transformer 14 and protection circuit 16 to an electrical feeder line 20 which terminates at an electrical load 22. Feeder line 20 may typically be a three phase, three or four wire distribution feeder, or may comprise a single phase two or one wire line. As illustrated in FIG. 1, at some point along its length, feeder line 20 is so close to a grounded high impedance object, such as a tree 24, that at least one wire of the feeder line may come into contact with the tree, indicated in FIG. 1 at fault point 26. This contact may cause a high impedance fault between feeder line 20 and high impedance object 24, by virtue of an electrical arc therebetween. Because the arc currents in the fault are often quite small, this type of fault often escapes detection and does not activate over current protection devices of the protection circuitry 16. However, even relatively small arcing currents can generate a large amount of localized heat build up, which may in turn result in a fire.

As discussed above, procedures are known for monitoring the conductor in a distribution network for high impedance faults. Many of these procedures are very effective. Nonetheless, the procedures are not always able distinguish between faults and other circumstances that procedure some fault-like symptoms. As a result, these procedures generate signals, referred to as false positives, that indicate the presence of a fault when, in fact, no fault actually exists. The present invention is directed toward reducing these false positives. Generally, this is done by classifying as false positives certain phenomena that are accompanied by defined phase shifts. Examples of such phenomena would be capacitors switching (very common in modern networks), large electric engines switching on and off, and other legitimate uses of a power grid.

Figure 2:
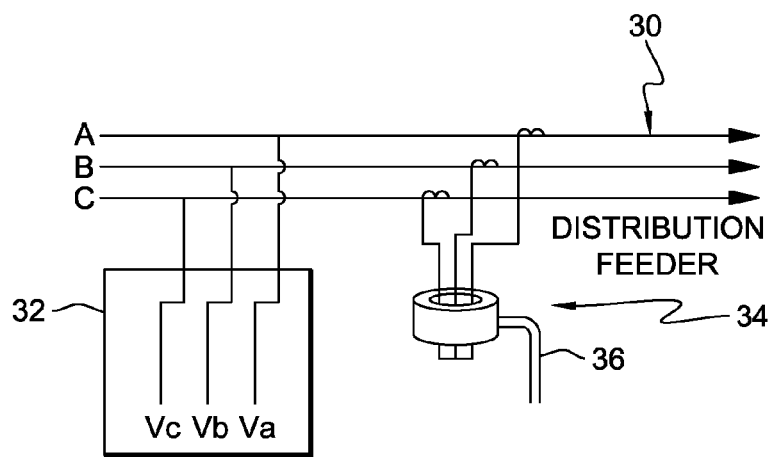
FIG. 2 illustrates sensing circuits in accordance with the principles of the invention.

FIG. 2 illustrates a typical three wire, three phase distribution feeder 30, and arrangements for monitoring the phase change of the fundamental frequency utilized by the fault detector. A high frequency fault detector 32 is connected to three phase system 30, where Va, Vb and Vc represent voltages for phases a, b and c. The circuit 32, which is more fully described below, is provided to identify false positives in high impedance fault detection. Current detector 34 is provided to sense current in conductors A, B and C. The output of the current detector is represented at 36.

Figure 3:
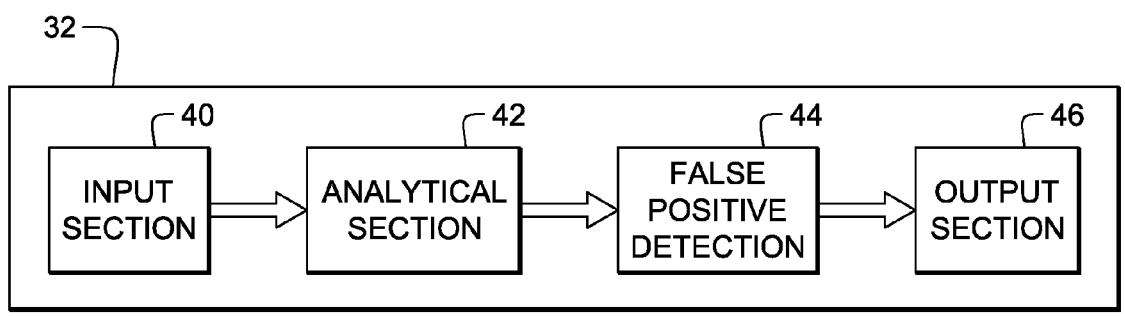
FIG. 3 shows a block diagram of a system of an embodiment of the invention.

FIG. 3 shows a block diagram of high impedance fault detector 32 which uses phase shifts to identify false positives when detecting high impedance faults. FIG. 3 shows four sections as follows: input section 40, analytical section 42, false positive detection section 44, and output section 46. The function of fault detector 32 is to detect high impedance faults by using input data like current, voltage, air ionization, ozone detection, sound and light detection or other type of data. Signals derived from a phase conductor of distribution feeder 30, by way of the voltage monitoring circuit and current monitoring circuit 34, are reduced to a level which is suitable for measurements. The phases of the voltages and/or currents are obtained from the derived signals.

Figure 4:
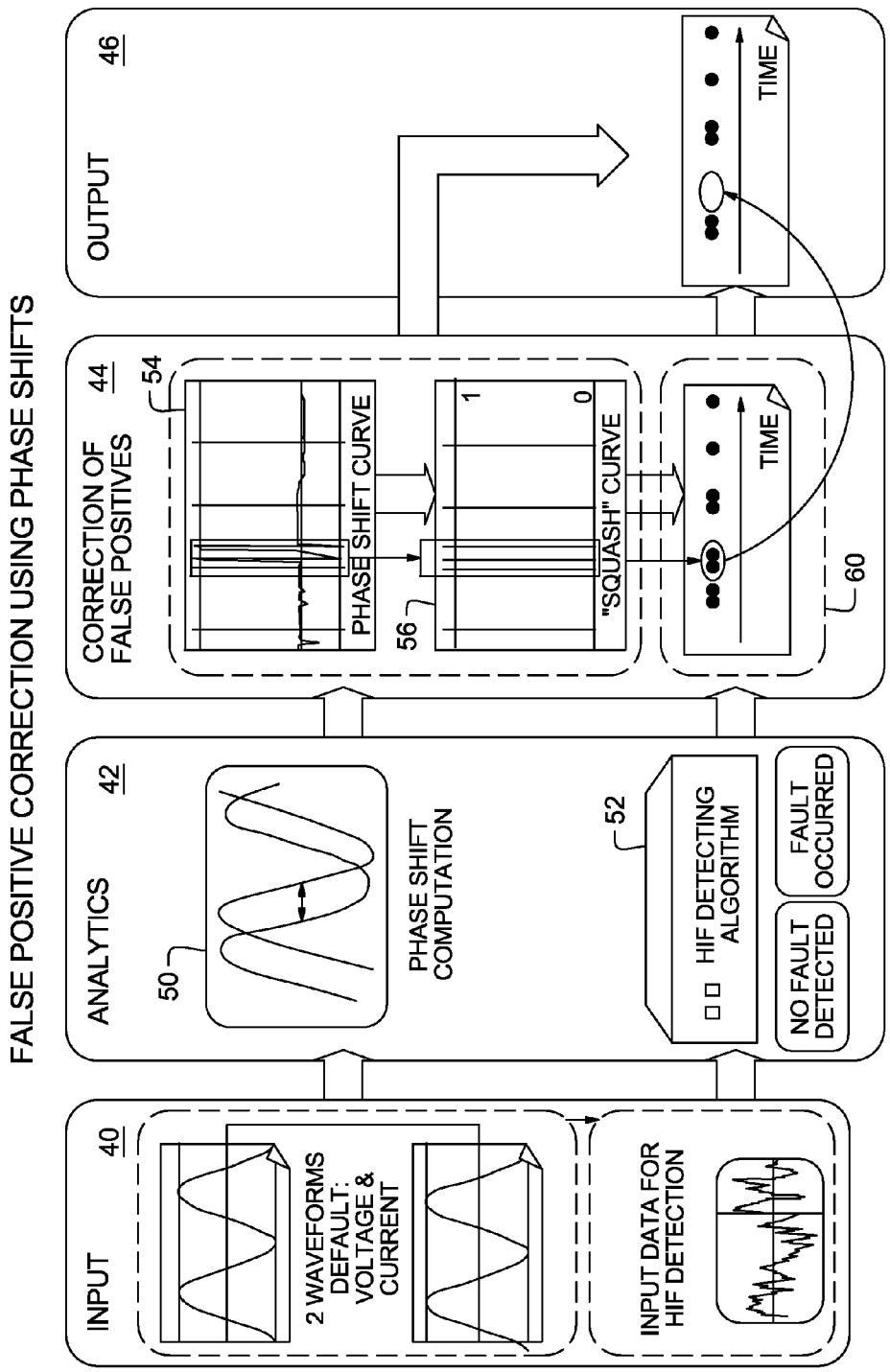
FIG. 4 is a block diagram showing the functions of the blocks of FIG. 3.

Referring to FIG. 4, there is disclosed a block diagram showing the functions of each section of FIG. 3. In block 40, the sixty cycle input voltage and current are received from a conductor of a three phase system and are fed to the analytical section 42 where, at 50, the phase shift between the voltage prior to and subsequent to an occurrence of a suspected high impedance fault is computed.

At the same time, reference input data (current, voltage, air ionization, ozone detection, sound and light detection or other type of data) is fed to a high impedance fault detection algorithm 52 executing a program code which generates an intermediate fault occurrence signal having a value of "P" (positive, fault occurred) or "N" (negative, no fault detected). As indicated above, many high impedance fault detection algorithms are very effective, however, they may generate false positive signals—signals that indicate the presence of a fault when no fault actually exists.

In accordance with the present invention, the phase shift computed at 50 is used to identify at least some of these false positives. In particular, if that computed phase shift meets defined criteria, a positive signal from algorithm 52 is considered to be a false positive.

Generally, output from computation 50 is fed to detection section 44. This section produces first or second values depending on whether the computed phase shift, respectively, does or does not, meet the defined criteria. For example, the detection section may produce a "0" if the computed phase shift meets the defined criteria (indicating a false positive), or a "1" if the computed phase shift does not meet the defined criteria (indicating a true positive). It may be noted that if no phase shift is detected at 50, detection section 44 produces a "1."

The value generated by detection section 44 is applied to or combined with the output of detecting algorithm 52 to produce a modified or finalized fault detection signal. Specifically, if algorithm 52 produces a P and section 44 generates a "0," then that P is replaced with a N, and section 44 then outputs this N. However, if algorithm 52 produces a P and section 44 generates a "1," then section 44 does not change the P generated by algorithm 52, and section 44 outputs this P signal. In this way, whenever the phase shift analysis algorithm generates a "0," a potential alarm signal by HIF detecting algorithm 52 is suppressed.

More specifically, in the operation of unit 32, the computed value of the phase shift between the voltage and current waveforms obtained in block 50 is fed to section 44 where, at block 54, the value of the phase shift is plotted as a phase shift curve. The phase shift curve from block 54 is then, by means of a mathematical transformation, reconfigured as a squash curve at block 56. When the value of the squash curve is above a user-determined value, a "0" is outputted and used to suppress an alarm from 52. When the value of the squash curve is below a user-determined value, a "1" is outputted and used to allow an alarm from 52.

Phase shift computation at block 50 of voltage and current waveforms is expressed as PS(t) which is Phase Shift e.g., in degrees as a function of time. Squash curve SC(t) computed at 42 is obtained in two steps using the phase shift PS(t) value. In a first step, SC(t) is set to "0" if the deviation of PS(t) from the mean value of PS is larger than a threshold "T"; and SC(t) is set to "1" if the deviation of PS(t) from the mean value of PS is smaller than the threshold T. In a second step, squash curve SC obtained in the first step is post processed using smoothing techniques such as convolution with a standard smoothing step function or using an averaging kernel (Linear, Gaussian, etc.).

For every value of "t" intermediate fault occurrence signal is set to, $$FOT(t)=iFOT(t)*SC(t).$$

Where FOT(t) is Fault Occurrence Table relative to time;
iFOT(t) is intermediate Fault Occurrence Table relative to time; and
SC(t) is Squash Curve relative to time.

The "P" or "N" resultant of the high impedance fault detection algorithm and the value of the squash curve are fed to block 60 of FIG. 4 where, if the squash curve is a "0" and the intermediate fault occurrence table is a "P", the positive fault readout is suppressed and replaced with "no fault" ("N") output. It can be also accompanied by an appropriate message informing an (human or automatic higher-level) operator that a fault message has been suppressed.

When single pole switching events occur on a single phase network, where a section of a conductor is disconnected from one phase and is back connected to another phase through the load, a compound offset with a capacitance decrease on one phase and a corresponding increase on the other phase of the circuit is produced. This situation gives rise to a change in residual current in phase with one of the phase to earth voltages, and effectively mimics the pattern for an earth fault. However, by monitoring the change in phase between the voltages, as described above, discrimination between this event and a real earth fault is facilitated.

Figure 5:
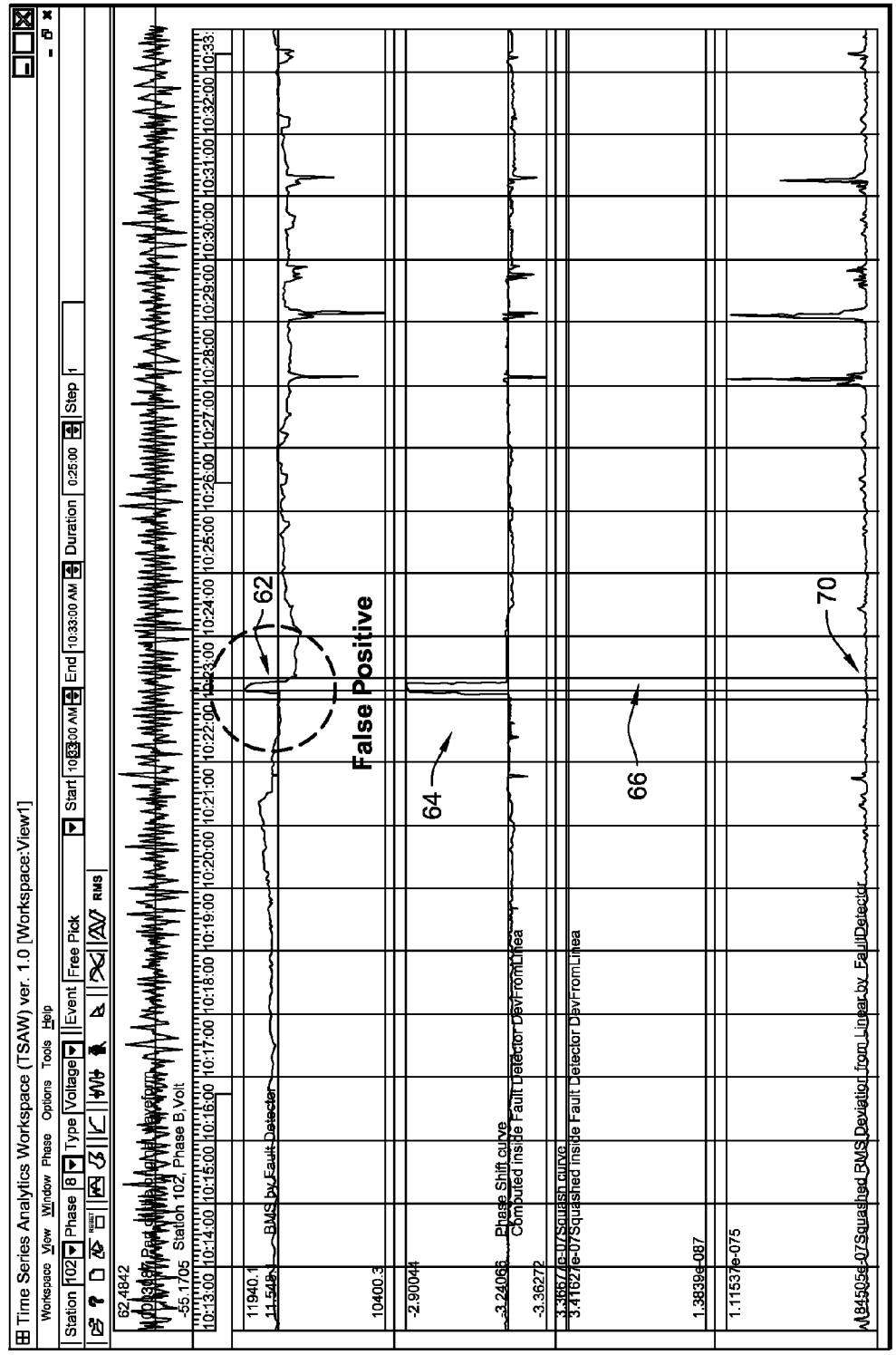
FIG. 5 is a graph showing various function of the invention when identifying a pulse caused by capacitive switching as being a false positive indication of a high impedance fault.

Referring to FIG. 5, there is shown the generation of a pulse signal 62 caused by capacitive switching that under normal conditions would be identified as a ground fault. However, by obtaining a phase shift curve 64, generating a squash curve 66 and multiplying the value of the iFOT with the "0", represented at 70, generated from the phase shift detecting algorithm, the occurrence is accurately identified as a false positive, not an actual fault.

Although the foregoing description has been explained in relation to a single phase arcing fault, such as a single phase line contacting a tree or the like, the technique and apparatus described herein is in fact applicable to a number of applications. For example, other arcing faults and phenomena can be detected, such as partial discharge through high impedance medium resulting from leakage currents in ageing or failing insulation material. Furthermore, high energy faults such as two phase and three phase line to line faults can be detected where these result in arcing between the conductors.

The various aspects of embodiments of the invention may be implemented by a computer executing a sequence of program instructions for carrying out the steps of the method, assuming all required data for processing is accessible to the computer. The sequence of program instructions may be embodied in a computer program product comprising media storing the program instructions. As will be readily apparent to those skilled in the art, aspects of the present invention can be realized in hardware, software, or a combination of hardware and software. Any kind of computer/server system(s)—or other apparatus adapted for carrying out the methods described herein—is suited. A typical combination of hardware and software could be a general-purpose computer system with a computer program that, when loaded and executed, carries out the method, and variations on the method as described herein. Alternatively, a specific use computer, containing specialized hardware for carrying out one or more of the functional tasks of the invention, could be utilized.

As will be appreciated by one skilled in the art, the present invention may be embodied as or in a system, method or computer program product. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product embodied in any tangible medium of expression having computer-usable program code embodied in the medium.

Any combination of one or more computer usable or computer readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM) or Flash memory), an optical fiber, a portable compact disc read-only memory (CD-ROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then complied, interpreted, of otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave, The computer usable program code may be transmitted using any appropriate medium, including but not limited to wireless, wireline, optical fiber cable, RF, etc.

Computer program code for carrying out operations of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a standalone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, though the Internet using an Internet Service Provider).

The present invention is described above with reference to flow chart illustrations and/or block diagrams of methods, apparatus (systems) and computer program products according to embodiments of the invention. It will be understood that each block of the flow chart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instructions means which implement the function/act specified in the flowchart and/or block diagram block of blocks.

The computer program instruction may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Figure 6:
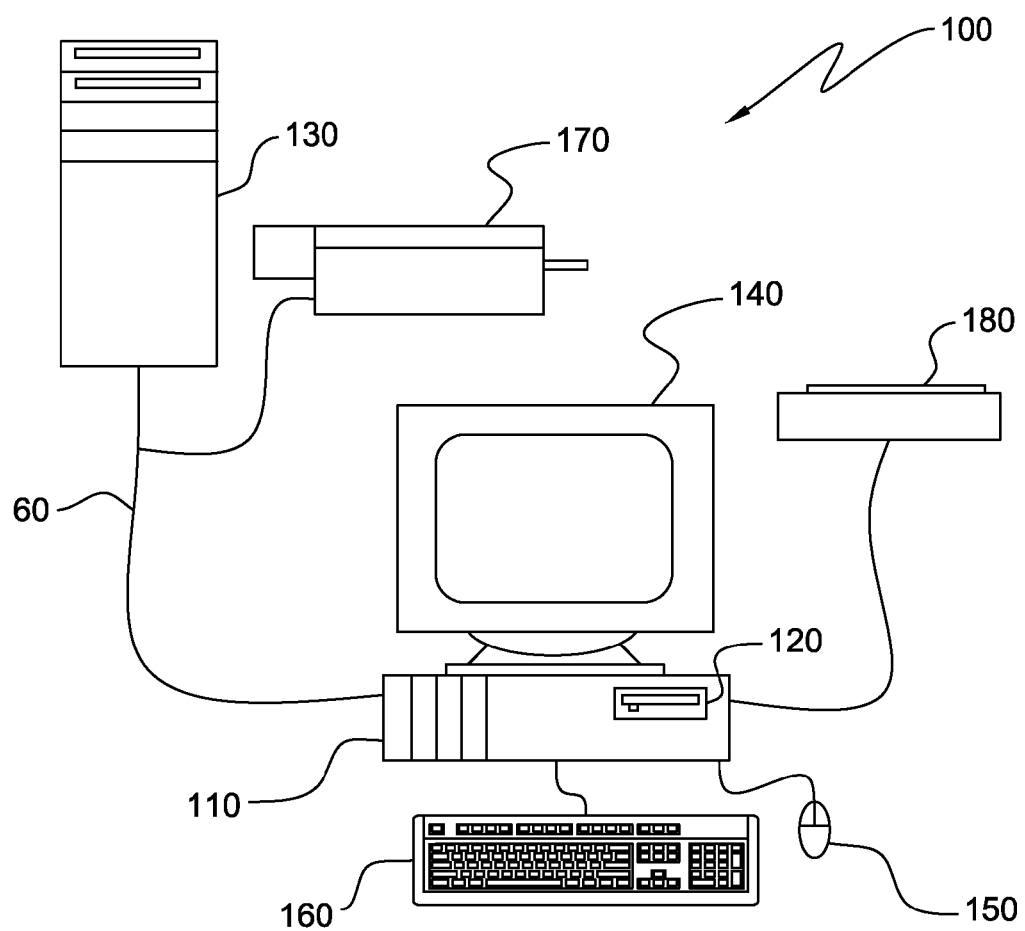
FIG. 6 shows a computer system that may be used in the implementation of the present invention.

For example, a computer-based system 100 in which embodiments of the invention may be carried out is depicted in FIG. 6. The computer-based system 100 includes a processing unit 110, which houses a processor, memory and other systems components (not shown expressly in the drawing) that implement a general purpose processing system, or computer that may execute a computer program product. The computer program product may comprise media, for example a compact storage medium such as a compact disc, which may be read by the processing unit 110 through a disc drive 120, or by any means known to the skilled artisan for providing the computer program product to the general purpose processing system for execution thereby.

The computer program product may comprise all the respective features enabling the implementation of the inventive method described herein, and which—when loaded in a computer system—is able to carry out the method. Computer program, software program, program, or software, in the present context means any expression, in any language, code or notation, of a set of instructions intended to cause a system having an information processing capability to perform a particular function either directly or after either or both of the following: (a) conversion to another language, code or notation; and/or (b) reproduction in a different material form.

The computer program product may be stored on hard disk drives within processing unit 110, as mentioned, or may be located on a remote system such as a server 130, coupled to processing unit 110, via a network interface such as an Ethernet interface. Monitor 140, mouse 150 and keyboard 160 are coupled to the processing unit 110, to provide user interaction. Scanner 180 and printer 170 are provided for document input and output. Printer 170 is shown coupled to the processing unit 110 via a network connection, but may be coupled directly to the processing unit. Scanner 180 is shown coupled to the processing unit 110 directly, but it should be understood that peripherals might be network coupled, or direct coupled without affecting the ability of the processing unit 110 to perform the method of the invention.

While it is apparent that the invention herein disclosed is well calculated to fulfill the objects stated above, it will be appreciated that numerous modifications and embodiments may be devised by those skilled n the art, and it is intended that the appended claims cover all such modifications and embodiments as fall within the true spirit and scope of the present invention.

A method, system and computer program product are disclosed for identifying false positive indications of high impedance faults in an AC electric power transmission and distribution network. In one embodiment, the method comprises using a procedure to monitor a phase conductor of the network for faults, said procedure generating a fault signal indicating a specified fault in the conductor. In this embodiment, the voltage and current waveform of the electric power conducted through the conductor are monitored. When a phase shift in said waveform is detected over a defined period of time, and said detected phase shift meets one or more given criteria, a correction signal is generated indicating that said fault signal is a false indication of the specified fault. The given criteria may include, for example, that the phase shift is more than a threshold value for a specified period of time.

What is claimed is:

1. A method of identifying false positive indications of high impedance faults in an AC electric power transmission and distribution network, said network including a phase conductor for conducting AC electrical power, the method comprising:
   using an amplitude monitoring procedure to monitor the phase conductor for amplitude disturbances indicative of specified faults, said procedure generating an initial fault signal indicating one of said specified faults in the conductor;
   monitoring a phase shift between a voltage and a current of the electric power conducted through the conductor;
   generating, based upon the monitoring of the phase shift, a correction signal when the phase shift between said voltage and said current is detected over a defined period of time and said detected phase shift meets one or more given conditions, the correction signal indicating that said initial fault signal is a false indication of said one of the specified faults indicated by the amplitude disturbances; and
   applying the generated correction signal to the initial fault signal to produce a modified fault signal that suppresses an alarm;
   wherein the phase shift monitoring includes: (a) generating a mean value for said phase shift over a given period of time; (b) comparing a plurality of values for said phase shift at a plurality of particular times to said mean value; and (c) generating a squash curve over the given period of time from said phase shift based on said comparing;
   wherein the generating the squash curve includes:
   (a) giving the squash curve a first value when the value for the phase shift at a given time exceeds said mean value by more than a threshold level;
   (b) giving the squash curve a second value when the value for the phase shift at a given time does not exceed said mean value by said threshold level; and
   (c) smoothing the squash curve over the given period of time based upon the first and second values given to the squash curve prior to the smoothing; and wherein the generating the correction signal includes generating the correction signal when the smoothed squash curve has a specified value.

2. The method according to claim 1, wherein the applying the correction signal includes changing the initial fault signal to a no fault signal.

3. The method according to claim 1, wherein said one or more given conditions includes said phase shift is more than a threshold value.

4. The method according to claim 3, wherein said one or more given conditions includes said phase shift is more than the threshold value for a specified period of time.

5. The method according to claim 1, wherein said threshold is adjustable by a user.

6. A system for identifying false positive indications of high impedance faults in an AC electric power transmission and distribution network, said network including a phase conductor for conducting AC electrical power, and said network further including a fault detector to monitor the phase conductor for amplitude disturbances indicative of specified faults, said fault detector generating an initial fault signal indicating one of said specified faults in the conductor, said system comprising:
   a monitor for monitoring a phase shift between a voltage and a current of the electric power conducted through the conductor; and
   a false positive detection unit for receiving the initial fault signal, wherein the false positive detection unit
   (a) detects, based upon the monitoring of the phase shift, the phase shift between said voltage and said current;
   (b) generates a correction signal when the phase shift between said voltage and said current is detected over a defined period of time and the detected phase shift meets one or more given conditions, indicating that said initial fault signal is a false indication of said one of the specified faults indicated by the amplitude disturbances; and
   (c) applies the generated correction signal to the initial fault signal to produce a modified fault signal that suppresses an alarm;
   wherein the monitoring the phase shift includes:
   (a) generating a mean value for said phase shift over a given period of time;
   (b) comparing a plurality of values for said phase shift at a plurality of particular times to said mean value; and
   (c) generating a squash curve over the given period of time from said phase shift based on said comparing;
   wherein the generating the squash curve includes:
   (a) giving the squash curve a first value when the value for the phase shift at a given time exceeds said mean value by more than a threshold level;
   (b) giving the squash curve a second value when the value for the phase shift at a given time does not exceed said mean value by said threshold level; and
   (c) smoothing the squash curve over the given period of time based upon the first and second values given to the squash curve prior to the smoothing; and
   wherein the generating the correction signal includes generating the correction signal when the smoothed squash curve has a specified value.

7. The system according to claim 6, wherein said given conditions includes said phase shift is greater than a threshold value for a specified period of time.

8. An article of manufacture comprising: at least one computer readable device having non-transitory computer readable program code embodied therein to identify false positive indications of high impedance faults in an AC electric power transmission and distribution network, said network including a phase conductor for conducting AC electrical power, and wherein an amplitude monitoring procedure is used to monitor the phase conductor for amplitude disturbances indicative of specified faults, said amplitude monitoring procedure generating an initial fault signal indicating one of said specified faults in the conductor, and said network further including a monitor for monitoring a phase shift between a voltage and a current of the electric power conducted through the conductor, said computer readable program code, when executing, causing the following to be performed:
   generating, based upon the monitoring of the phase shift, a correction signal when the phase shift between said voltage and said current is detected over a defined period of time and said detected phase shift meets one or more given conditions, the correction signal indicating that said fault signal is a false indication of said one of the specified faults indicated by the amplitude disturbances; and applying the generated correction signal to the initial fault signal to produce a modified fault signal that suppresses an alarm;

wherein the phase shift monitoring includes:
(a) generating a mean value for said phase shift over a given period of time;
(b) comparing a plurality of values for said phase shift at a plurality of particular times to said mean value; and
(c) generating a squash curve over the given period of time from said phase shift based on said comparing;

wherein the generating the squash curve includes:
(a) giving the squash curve a first value when the value for the phase shift at a given time exceeds said mean value by more than a threshold level;
(b) giving the squash curve a second value when the value for the phase shift at a given time does not exceed said mean value by said threshold level; and
(c) smoothing the squash curve over the given period of time based upon the first and second values given to the squash curve prior to the smoothing; and wherein the generating the correction signal includes generating the correction signal when the smoothed squash curve has a specified value.

9. The article of manufacture according to claim 8, wherein said given criteria includes said phase shift is more than a threshold value for a specified period of time.

\* \* \* \* \*